United States Patent
Kumar et al.

(10) Patent No.: US 10,153,729 B2
(45) Date of Patent: Dec. 11, 2018

(54) NANO-SCALE OSCILLATOR EXHIBITING CHAOTIC OSCILLATION

(71) Applicant: HEWLETT PACKARD ENTERPRISE DEVELOPMENT LP, Houston, TX (US)

(72) Inventors: Suhas Kumar, Palo Alto, CA (US); John Paul Strachan, San Carlos, CA (US); Gary Gibson, Palo Alto, CA (US); R. Stanley Williams, Portola Valley, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 99 days.

(21) Appl. No.: 15/141,410

(22) Filed: Apr. 28, 2016

(65) Prior Publication Data
US 2017/0317646 A1 Nov. 2, 2017

(51) Int. Cl.
*H03B 7/06* (2006.01)
*H03B 5/04* (2006.01)
*H03K 19/20* (2006.01)

(52) U.S. Cl.
CPC .............. *H03B 7/06* (2013.01); *H03B 5/04* (2013.01); *H03K 19/20* (2013.01)

(58) Field of Classification Search
CPC ..... H04L 27/001; H04L 9/001; H04L 9/0668; H04L 2209/12; H04L 2209/20; H04L 2209/26; H04L 2209/72; H03B 5/04; H03B 5/1215; H03B 29/00; H03B 5/1228; H03B 5/1253; H03B 5/1278; H03B 5/1296; H03B 5/366; H03B 5/1231; H03B 5/1243; H03B 7/06; H03K 19/20
USPC ......... 365/148, 100, 129; 977/754; 257/4, 5; 331/78

See application file for complete search history.

(56) References Cited

U.S. PATENT DOCUMENTS

| | | |
|---|---|---|
| 7,985,962 B2 | 7/2011 | Bratkovski et al. |
| 8,113,437 B2 | 2/2012 | Kang |
| 8,274,813 B2 * | 9/2012 | Pickett ..................... H03B 7/06 257/4 |
| 8,324,976 B2 | 12/2012 | Borghetti et al. |
| 8,767,449 B2 | 7/2014 | Pickett et al. |
| 2010/0084627 A1 | 4/2010 | Berger et al. |
| 2011/0147464 A1 | 6/2011 | Kang |
| 2011/0182107 A1 | 7/2011 | Wu et al. |
| 2011/0182108 A1 | 7/2011 | Williams et al. |
| 2011/0266515 A1 | 11/2011 | Pickett et al. |
| 2014/0361851 A1 | 12/2014 | Keane et al. |
| 2015/0008988 A1 | 1/2015 | Zidan et al. |

OTHER PUBLICATIONS

Junji Ohtsubo, Semconductor Lasers: Stability, Instability and Chaos, 2013 (4 pages).

(Continued)

*Primary Examiner* — Arnold Kinkead
(74) *Attorney, Agent, or Firm* — Trop, Pruner & Hu, P.C.

(57) ABSTRACT

In some examples, a device includes a nano-scale oscillator that exhibits chaotic oscillation responsive to a control input to the nano-scale oscillator, where the control input including a tunable input parameter.

18 Claims, 5 Drawing Sheets

(56) References Cited

OTHER PUBLICATIONS

Kennedy, Michael Peter—Three Steps to Chaos—Part II: A Chua's Circuit Primer, IEEE Transactions on Circuits and Systems, Apr. 1993 (18 pages).
Mikhail Prokopenko http://frontiersin.org/people/u/132401Frontiers, Grand Challenges for Computational Intelligence, Frontiers Spotlight Conference Award, 2014 (11 pages).
Tian Xiao-Bo et al., Chin. Phys. B, vol. 22, No. 8, The design and simulation of a titanium oxide memristor-based programmable analog filter in a simulation program with integrated circuit emphasis, Oct. 31, 2012 (10 pages).
Wikipedia, Chua's circuit last modified on Mar. 25, 2016 (7 pages).
Wikipedia, Double pendulum last modified on Feb. 15, 2016 (6 pages).
Wikipedia, Memristor last modified on Mar. 6, 2016 (25 pages).
Wikipedia, Negative resistance last modified on Feb. 28, 2016 (37 pages).
Zidan, M.A. et al., A Family of Memristor-based Reactance-less oscillators, Apr. 11, 2013 (22 pages).
Ascoli, A. et al., Nonlinear Dynamics of a Locally-Active Memristor, Circuits and Systems I: Regular Papers, IEEE Transactions on 62 (Apr. 2015) pp. 1165-1174.
Backus, J., Can Programming be Liberated from the Von Neumann Style? A Functional Style and its Algebra of Programs, Communications of the ACM 21, (1978) pp. 613-641.
Bertschinger et al., Real-Time Computation at the Edge of Chaos in Recurrent Neural Networks, (2004) (28 pages).
Chua, L. et al., Neurons are Poised Near the Edge of Chaos, International Journal of Bifurcation and Chaos 22, 1250098 (2012) (50 pages).
Chua, L. O., Local activity is the origin of complexity, International Journal of Bifurcation and Chaos, 15, (2005) pp. 3435-3456.
Chua, L. O., Passivity and Complexity, Circuits and Systems I: Fundamental Theory and Applications, IEEE Transactions on 46 (1999) pp. 71-82.
Chua, L., Memristor, Hodgkin-Huxley, and Edge of Chaos, Nanotechnology 24, 383001 (2013) (14 pages).
Dogaru, R. and Chua, L. O., Edge of Chaos and Local Activity Domain of FitzHugh-Nagumo Equation, International Journal of Bifurcation and Chaos 8 (1998) (24 pages).
Driscoll et al., Chaotic Memristor, Applied physics A 102 (2011) pp. 885-889.
Esmaeilzadeh, Hadi et al., Dark Silicon and the End of Multicore Scaling, ISCA Jun. 2011 (12 pages).
Feng, Q. and He, H., Modeling of the Mean Poincare Map on a Class of Random Impact Oscillators, European Journal of Mechanics-A/Solids 22 (2003), pp. 267-281.
Kauffman, S. A., Requirements for Evolvability in Complex Systems: Orderly Dynamics and Frozen Components, Physica D: Nonlinear Phenomena 42, (1990) pp. 135-152.
Kumar et al., Local Temperature Redistribution and Structural Transition During Joule-Heating-Driven Conductance Switching in VO2, Advanced Materials 25, doi:10.1002/adma.201302046 (2013) pp. 6128-6132.
Kuznetsov, Y. A., Elements of Applied Bifurcation Theory, Second Edition, vol. 112 (Springer Science & Business Media, 2013) (614 pages).
Pickett et al., Coexistence of Memristance and Negative Differential Resistance in a Nanoscale MetalOxideMetal System, Advanced Materials 23 (2011) pp. 1730-1733.
Pickett, M. D., et al., A Scalable Neuristor Built with Mott Memristors, Nature materials 12, doi:10.1038/nmat3510 (Dec. 2012) (4 pages).
Seifter et al., Lambda and the Edge of Chaos in Recurrent Neural Networks, Artificial Life 21 (2015) pp. 55-71.
Wang, G. et al., A Chaotic Oscillator Based on HP Memristor Model, Mathematical Problems in Engineering 2015 (2015) (13 pages).
Whitman et al., U.S. White House, A Nanotechnology-Inspired Grand Challenge for Future Computing, <https://www.whitehouse.gov/blog/2015/10/15/nanotechnology-inspired-grand-challenge-future-computing> (2015) (4 pages).
Williams, R. Stanley et al., OSTP Nanotechnology-Inspired Grand Challenge: Sensible Machines (extended version 2.5), IEEE Rebooting Computing, Oct. 2015 (31 pages).
Wolf, A. et al., Determining Lyapunov Exponents from a Time Series, Physica D: Nonlinear Phenomena 16 (1985) pp. 285-317.
Itoh, M., et al.; "Memristor Oscillators"; Jul. 15, 2008; 24 pages.
Muthuswamy, B., et al.; "Memristor Based Chaotic Circuits"; Nov.-Dec. 2009; 16 pages.
Pershin, Y. V., et al.; "Practical approach to programmable analog circuits with memristors", Aug. 2009; 8 pages.
Sun, W., et al.; "A Memristor Based Chaotic Oscillator"; Jun. 10, 2009; 3 pages.

\* cited by examiner

NANO-SCALE OSCILLATOR EXHIBITING CHAOTIC OSCILLATION

BACKGROUND

Electronic systems are continually facing increasing demands for computation power and storage capacity. Moore's law is the observation that the density of active elements (such as transistors, storage cells, etc.) in an integrated circuit device doubles approximately every two years. However, more recently, the pace of advancement in increasing the density of active elements in an integrated circuit device has slowed. As a result, device makers are facing a bottleneck in dealing with the increased demand for computation and storage capacities.

BRIEF DESCRIPTION OF THE DRAWINGS

Some implementations of the present disclosure are described with respect to the following figures.

DETAILED DESCRIPTION

As advancement in increasing the density of active elements in an integrated circuit device, such as a processor, memory device, and so forth, has slowed, designers and manufacturers of electronic devices are facing a bottleneck in producing devices that are able to meet the increasing demands for processing and storage capacities.

To address the foregoing issues, alternative electronic systems that rely on chaotic behavior can be employed. Chaos can refer to the extreme sensitivity of a system's behavior to very small changes to its input. Examples of electronic systems that exhibit chaotic behavior include those that employ system-level components (such as discrete integrated circuit devices, discrete resistors and capacitors, etc.) to achieve a design that provides chaotic behavior under certain conditions. However, system-level components can be expensive to use and can have high power consumption.

In accordance with some implementations of the present disclosure, a nano-scale oscillator is provided that exhibits chaotic oscillation responsive to a control input to the nano-scale oscillator. The control input includes a tunable input parameter. Note that a control input including a tunable input parameter can refer to a control input that includes a single tunable input parameter, or multiple tunable input parameters. A tunable input parameter refers to an input parameter that can be adjusted by a control entity to change the behavior of the nano-scale oscillator. Examples of tunable input parameters (which can be dynamically adjusted or varied during operation of a device that includes the nano-scale oscillator) include an input voltage, an input current, a resistance, and temperature. In other examples, parameters such as dimensions of the device and materials used in the nano-scale oscillator can control the chaotic behavior of the nano-scale oscillator.

An oscillator can refer to an electronic circuit that produces an oscillating signal during operation of the electronic circuit. An oscillator that exhibits chaotic oscillation can refer to an oscillator that produces an oscillating signal that has irregular variations to changes in input to the oscillator. A nano-scale oscillator or other type of component can refer to a component that has dimensions in the nanometer (nm) range, such as a dimension that is less than 1 micrometer. More specifically, in some examples, a nano-scale component can have dimensions each less than 500 nm, or less than 100 nm, and so forth.

Figure 1:
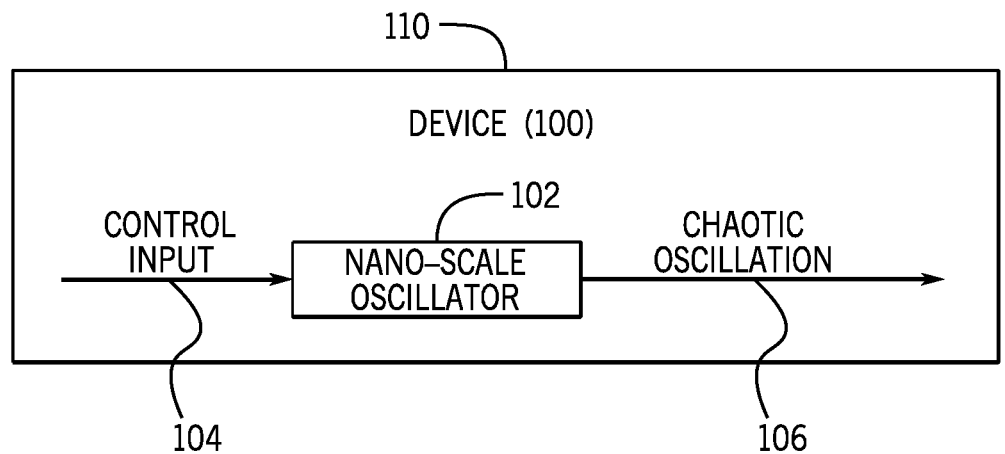
FIG. 1 is a block diagram of a device including a nano-scale oscillator according to some examples.

FIG. 1 shows an example device 100, which can be an integrated circuit (IC) device formed using solid state manufacturing techniques. Solid state manufacturing can refer to a manufacturing technique in which successive layers of materials are formed on a substrate (e.g. a silicon substrate or other semiconductor substrate), with each layer subjected to patterning to form target structures, such as those for transistors, storage cells, or other electronic elements. Such a substrate can be represented as 110 in FIG. 1.

The device 100 includes a nano-scale oscillator 102. Although just one nano-scale oscillator 102 is shown in FIG. 1, it is noted that the device 100 can include multiple nano-scale oscillators 102. The device 100 including one nano-scale oscillator 102 or multiple nano-scale oscillators can form a building block for a larger electronic system, such as a computer system, a storage system, a communication system, and so forth.

As examples, the electronic system can be used to perform any or some combination of the following operations: encrypting and/or decrypting data, encoding and/or decoding data, performing a cryptographic operation, computing a solution for a set of equations, generating random or pseudo-random numbers, communicating information in a network, performing machine learning, performing operations of a neural network, or other operations.

The chaotic behavior of the nano-scale oscillator 102 according to some implementations can be used to increase the computation and storage capacity of an electronic system, as compared to electronic systems that rely on the ordered behavior of electronic components. In this manner, devices that include the nano-scale oscillators according to some implementations can be used to meet the increasing demands for computation and storage capacity.

The nano-scale oscillator 102 receives a control input 104, which can include a tunable input parameter or multiple tunable input parameters. A tunable input parameter can be controlled (i.e. the input parameter can be settable to any of various different values) by an entity that is external of the device 100 or that is part of the device 100. The control input 104 can be controlled electronically, such as by a hardware processing circuit or a combination of machine-readable instructions executable on the hardware processing circuit.

When the tunable input parameter(s) is (are) set to a value that is within a specified range (or specified ranges), the nano-scale oscillator 102 can be caused to exhibit chaotic oscillation (i.e. outputs an oscillating signal 106 that exhibits chaotic behavior by having chaotic oscillation). The nano-scale oscillator 102 can include a chaotic regime and a non-chaotic regime (or ordered regime). In the ordered or non-chaotic regime, the nano-scale oscillator 102 does not exhibit chaotic behavior. The nano-scale oscillator 102 is placed in the chaotic regime in response to the input parameter(s) being set to within a specified range(s). When the input parameter(s) is (are) set to outside the specified range(s), then the nano-scale oscillator 102 exhibits non-chaotic (or ordered) behavior.

It is noted that chaotic behavior of the nano-scale oscillator 102 is deterministic based on a set of equations that characterize the behavior of the nano-scale oscillator 102. Thus, the irregular oscillations (i.e. chaotic oscillations) of the nano-scale oscillator 102 are not random—rather, they can be determined so long as the initial state of the nano-scale oscillator 102 is known and the set of equations characterizing the behavior of the nano-scale oscillator 102 is known.

Reference to the chaotic oscillation of the nano-scale oscillator 102 can refer to the chaotic oscillation within the chaotic regime of the nano-scale oscillator 102, or at the edge of the chaotic regime, where the edge of the chaotic regime can refer to the line that divides the ordered regime and the chaotic regime of the nano-scale oscillator 102.

Figure 2:
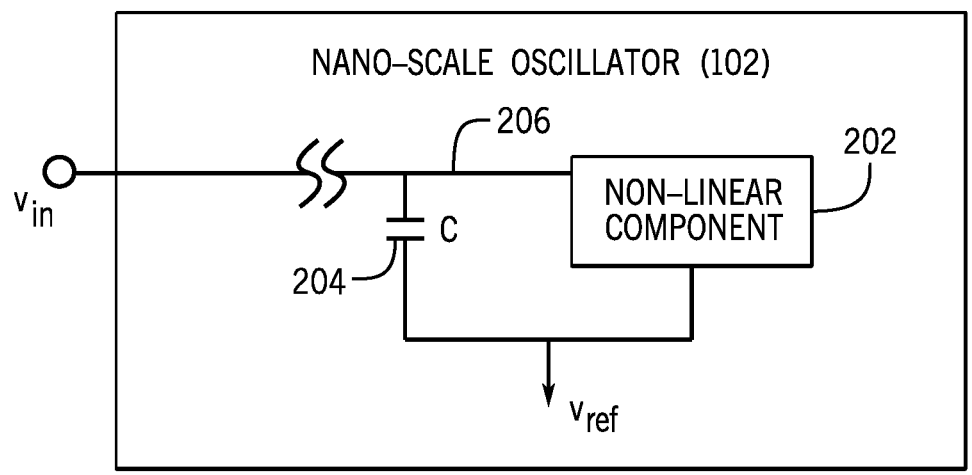
FIG. 2 is a block diagram of a nano-scale oscillator according to some examples.

FIG. 2 is a schematic diagram of an example nano-scale oscillator 102 according to some examples. The nano-scale oscillator 102 includes a non-linear component 202 that exhibits a non-linear response to an input parameter. In some examples, the non-linear component can exhibit a non-linear response to temperature, or some other parameter, or a combination of parameters. In some examples, the non-linear response includes a negative differential resistance (NDR). NDR is a property of a component where an increase in current through the component results in a decreased voltage across the component in a specific region of operation (e.g. where the specific region of operation can include a specific range of current through the component).

In other examples, the non-linear response is a negative differential capacitance or negative differential inductance.

As explained further below, the non-linear component 202 can exhibit NDR in multiple regions (or regimes) of operation of the non-linear component 202. More generally, the non-linear component 202 can exhibit a non-linear response in multiple negative differential response regimes.

A parallel capacitor 204 in the nano-scale oscillator is connected to the non-linear component 202. A first terminal of the parallel capacitor 204 is connected to a reference voltage $v_{ref}$, such as ground or another reference voltage. A terminal of the non-linear component 202 is also connected to the reference voltage $v_{ref}$. A second terminal of the capacitor 204 is connected to a node 206 that is connected to another terminal of the non-linear component 202. The terminal 206 can be connected through a resistor to an input voltage $v_{in}$ to the nano-scale oscillator 102.

The parallel capacitor 204 is used as an energy storing element, to allow the combination of the non-linear component 202 and the capacitor 204 to oscillate under certain conditions.

If the nano-scale oscillator 102 is to be operated in the chaotic regime or at the edge of the chaotic regime, then the input voltage, $v_{in}$, can be set to a value that is within a specific range (or within one of multiple specific ranges), to cause chaotic oscillation of the nano-scale oscillator 102. On the other hand, if the nano-scale oscillator 102 is to be operated in the ordered regime, then the input voltage, $v_{in}$, can be set to a value that is outside the specific range (or outside the multiple specific ranges), to cause ordered oscillation of the nano-scale oscillator 102.

Figure 3:
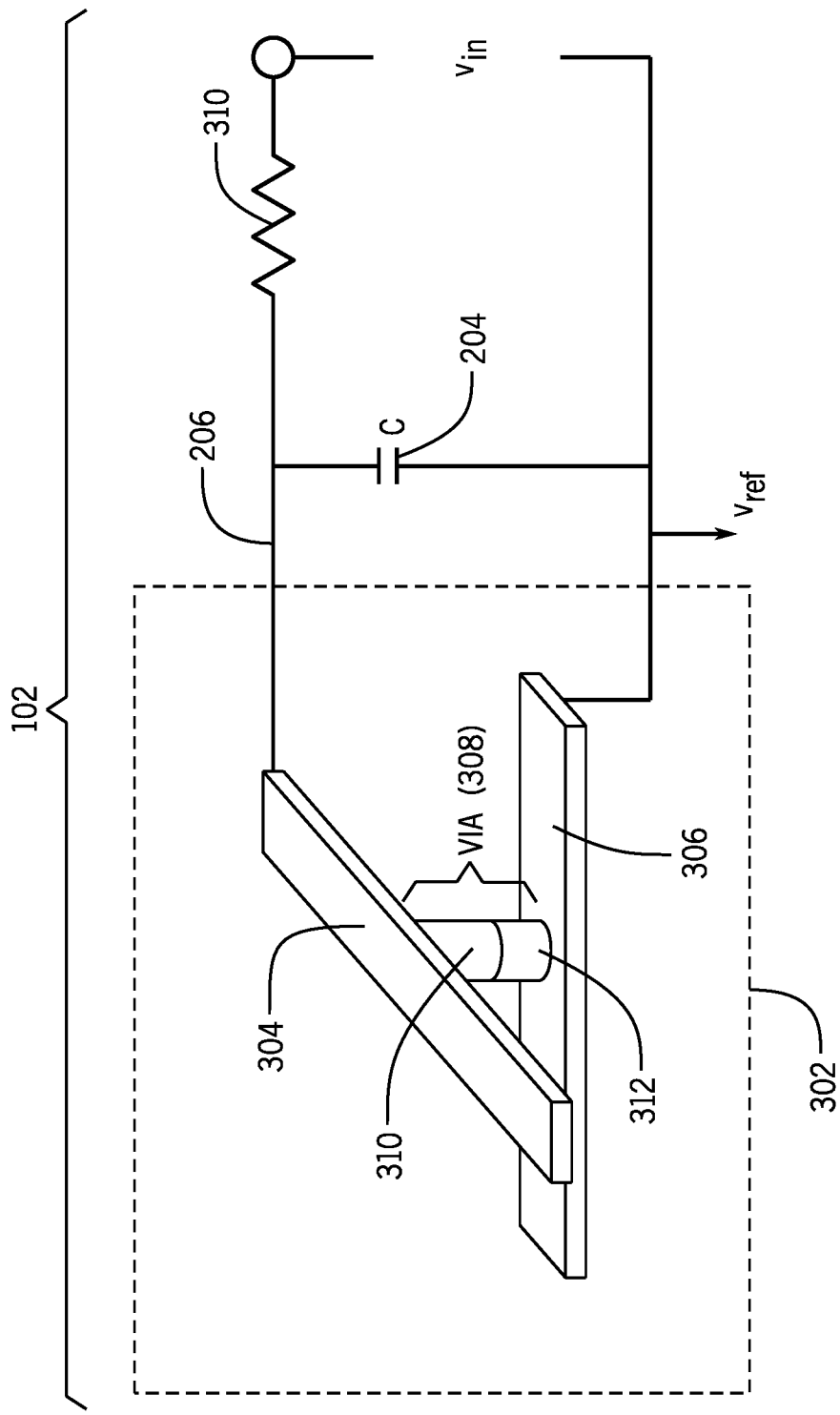
FIG. 3 is a block diagram of a nano-scale oscillator including a memristor, in accordance with some examples.

FIG. 3 is a schematic diagram of a nano-scale oscillator 102 according to further specific examples. In examples according to FIG. 3, the non-linear component 202 of FIG. 2 is a memristor 302, which can exhibit NDR. A memristor 302 is an electronic component that is programmable to different resistive states (e.g. between a high resistance state and a low resistance state) in response to input energy (e.g. a voltage or current) provided to the memristor.

The memristor 302 can exhibit NDR in multiple regimes, due to the high non-linear temperature dependence of resistance of the memristor 302. In some examples, the nano-scale oscillator 102 according to FIG. 3 is a Pearson-Anson oscillator including the memristor 302 according to some examples. The memristor 302 includes an upper electrode 304 and a lower electrode 306. The upper and lower electrodes 304 and 306 are electrical conductors. In some examples, a via 308 interconnects the upper electrode 304 and the lower electrode 306. The via 308 can include a first via portion 310 and a second via portion 312. The upper electrode 304 provides the oscillation signal 106 depicted in FIG. 1.

In some examples, the first via portion 310 includes a material such as niobium oxide, vandalum oxide, or another material. More generally, the first via portion 310 includes a material that exhibits a voltage controlled insulator/conductive phase of transformation, such that a relatively sharp metal-insulator transition (MIT) can be provided.

The second via portion 312 includes a material such as titanium nitride (TiN), hafnium nitride (HfN), or another material.

The upper electrode 304 can be formed of a metal, such as platinum or other type of metal, or any other type of electrically conductive material. The lower electrode 306 can be formed of a metal, such as tungsten (W), or any another type of metal, or any other electrically conductive material.

The diameter of the via 308 can be less than 100 nm in some examples. The via 308 may be etched through a layer of insulating silicon oxide ($SiO_2$) to provide mechanical stability and electrical isolation from neighboring devices.

The capacitor 204 is connected in parallel with the memristor 302, where the first terminal of the capacitor 204 is connected to the upper electrode 304 of the memristor 202, and the second terminal of the capacitor 204 is connected to the lower electrode 306 of the memristor 302. The second terminal of the capacitor 204 and the lower electrode 306 of the memristor 302 are connected to the reference voltage $v_{ref}$. The node 206 to which the first terminal of the capacitor 204 is connected is coupled through a series resistor 310 to the input voltage $v_{in}$.

Although the capacitor 204 is shown as being separate from the memristor 302, it is noted that in other examples, the capacitor 204 can represent an integrated capacitance that is part of the memristor 302. This integrated capacitance can be provided between the electrodes 304 and 306. By using the integrated capacitance, a separate component can be omitted in the nano-scale oscillator 102.

Figure 4:
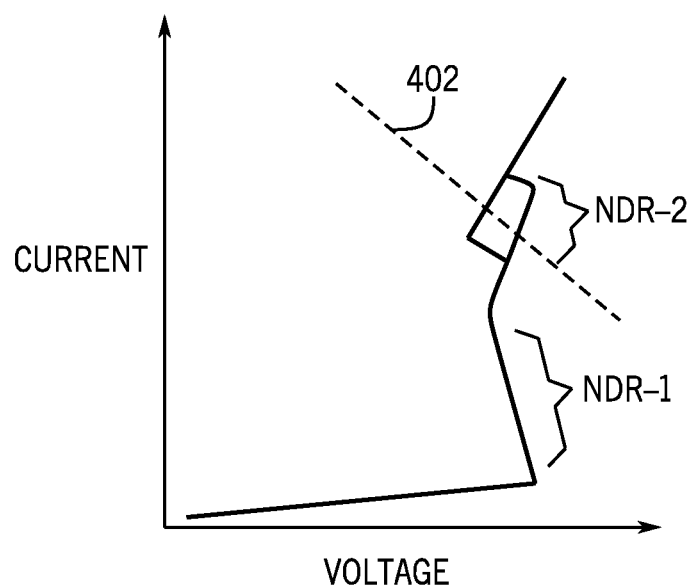
FIG. 4 is a voltage-current plot of a behavior of a nano-scale oscillator according to some examples.

FIG. 4 shows an example of a quasi-static current-voltage plot depicting a behavior of the memristor 302 according to some examples. The current-voltage plot of FIG. 4 is obtained by sweeping the current through the memristor 302. As shown by FIG. 4, the memristor 302 exhibits multiple regions of current-controlled NDR, depicted as NDR-1 and NDR-2 in FIG. 4. The memristor 302 exhibits a first region of current-controlled NDR (NDR-1) at lower currents (a first range of electrical currents), and a second region of current-controlled NDR (NDR-2) at higher currents (a second, different range of electrical currents). The second region of current-controlled NDR (NDR-2) actually includes a pair of NDR responses that form a hysteresis loop (a box-like response as shown in FIG. 4).

In some examples, the following set of equations (Eqs. 1-5) characterize the behavior of the memristor 302, with temperature (T) as the order parameter (state variable).

$$i_m = \left[ A\sigma_0(T) \left( \frac{k_B T}{\beta \sqrt{v_m}} \right)^2 \left\{ 1 + \frac{\beta \sqrt{v_m/t}}{k_B T} - 1 \right\} e^{\frac{\beta \sqrt{v_m/t}}{k_B T}} + \frac{A\sigma_0(T)/t}{2} \right] v_m. \quad \text{(Eq. 1)}$$

$$\sigma_0(T) = 2 \times 10^4 e^{\frac{0.301}{k_B T}}. \quad \text{(Eq. 2)}$$

$$\frac{dT}{dt} = \frac{i_m v_m}{C_{th}} - \frac{T - T_{amb}}{C_{th} R_{th}(T)} + \eta(T). \quad \text{(Eq. 3)}$$

$$R_{th}(T) = 1.4 \times 10^6 (\text{for } T \le T_c) \text{ and } 2 \times 10^6 (\text{for } T \le T_c). \quad \text{(Eq. 4)}$$

$$\eta(T) = T \left( \frac{k_B}{C_{th}} \right)^{\frac{1}{2}} \frac{4\pi}{R_{th} C_{th}} rand(-1 \leftrightarrow 1). \quad \text{(Eq. 5)}$$

In the above equations, $v_m$ is the voltage across the memristor 302; $i_m$ is the current through the memristor 302, written in the form $i_m = [G(v_m,T)]v_m$, where $G(v_m,T)$ is the memductance of the memristor 302; $\beta$ is a constant=2.6× $10^{-24}$ in some examples; T is the temperature in Kelvins (K); $T_{amb}$ is the ambient temperature; $C_{th}$ is the thermal capacitance; $\eta(T)$ is the thermal perturbation; rand($-1 \leftrightarrow 1$) is a random real number between $-1$ and $1$; $k_B$ is the Boltzmann constant; $R_{th}(T)$ is a temperature dependent thermal resistance that undergoes an abrupt change at the critical temperature $T_C$=1,100 K; and t represents time.

Eq. 3 is an equation of state describing the dynamic behavior of temperature in relation to the electrical power and thermal properties of the memristor 302, represented by $C_{th}$ and $R_{th}(T)$. More specifically, $C_{th}$ and $R_{th}(T)$ are the effective thermal capacitance and thermal resistance, respectively, between the electrically active portion of the via portion 310 (formed of niobium oxide for example) and its ambient environment.

By including a series resistance, $R_S$ (which is the resistance of the resistor 310 in FIG. 3), Eq. 3 is modified to $$\frac{dT}{dt} = \frac{(v_{in} - i_m R_s) i_m}{C_{th}} - \frac{T - T_{amb}}{R_{th} C_{th}}$$

(neglecting noise),
where $v_{in}$ is the DC input voltage across the series combination of $R_S$ and the memristor 302.

Given a constant DC input voltage, $v_{in}$, and the series resistance, $R_S$, a region of operation can be defined for the nano-scale oscillator 102, where this region of operation is represented by a load line 402 in FIG. 4. The load line 402 passes through NDR-2 in FIG. 4, which corresponds to a region of operation of the nano-scale oscillator 102 that exhibits chaotic oscillation.

In some examples, to access chaotic behavior in the nano-scale oscillator 102, three features of the nano-scale oscillator 102 are present. First, the nano-scale oscillator 102 has dimensions in the nano-scale range, e.g. less than 100 nm or other values as listed further above. Using the nano-scale oscillator 102 with dimensions in the nano-scale range decreases the thermal capacitance ($C_{th}$), thereby increasing the memristor's sensitivity to thermal noise (as expressed by Eqs. 3 and 5).

Figure 5:
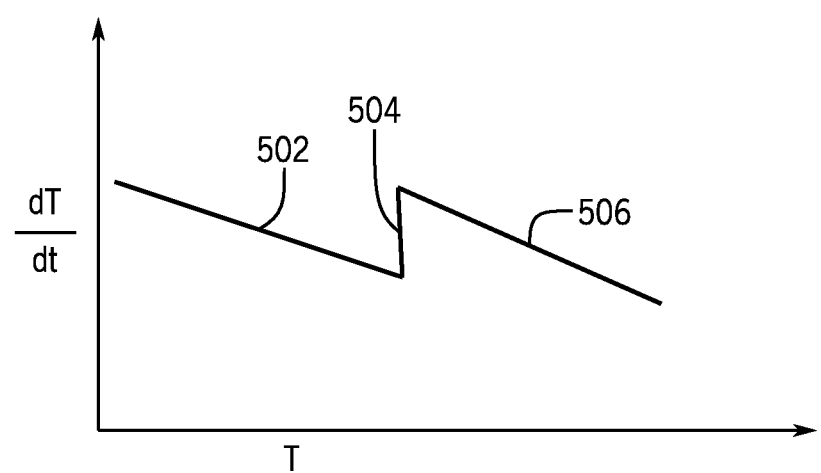
FIG. 5 is a plot of temperature to a differential of temperature with respect to time, of a behavior of a nano-scale oscillator according to some examples.

Second, the nano-scale oscillator 102 has multiple NDR regions, as shown in FIG. 4, so that Eq. 3 has multiple equilibrium regions. FIG. 5 is a plot of $$\frac{dT}{dt}$$

(as expressed by Eq. 3) to temperature (T). For a given DC input voltage, $$\frac{dT}{dt}$$

exploits three equilibrium regions 502, 504, and 506 in three different temperature (T) ranges, with the middle equilibrium region 504 being unstable and the equilibrium regions 502 and 506 on the two sides of the equilibrium position 504 being stable. The presence of a high-energy (unstable) equilibrium region 504 flanked by stable equilibrium regions is a fingerprint of local activity that gives rise to NDR, such that chaotic behavior can be exhibited. Thus, the nano-scale oscillator 102 has a response that includes an unstable region flanked by stable regions in any operating space (where an operating space can be defined by values of one or multiple parameters, such as voltage, current, etc.) for different temperatures.

Third, the nano-scale oscillator 102 includes two NDR regions 402 and 404 (FIG. 4) at approximately the same voltage range (as shown in FIG. 4). As a result, the nano-scale oscillator 102 can be pushed into chaos by small oscillatory forces like thermal noise.

Figure 6B:
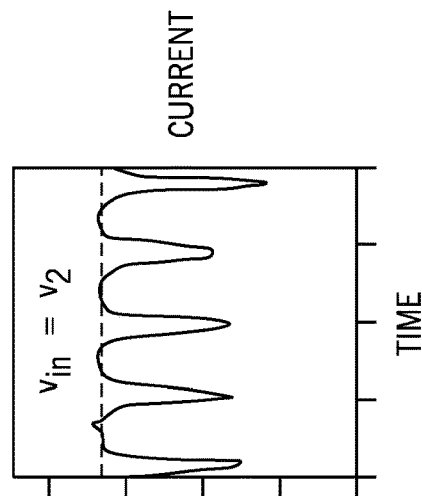
FIGS. 6A and 6B are plots of oscillating signals in the chaotic regime and ordered regime of a nano-scale oscillator, respectively, according to some examples.
Figure 6A:
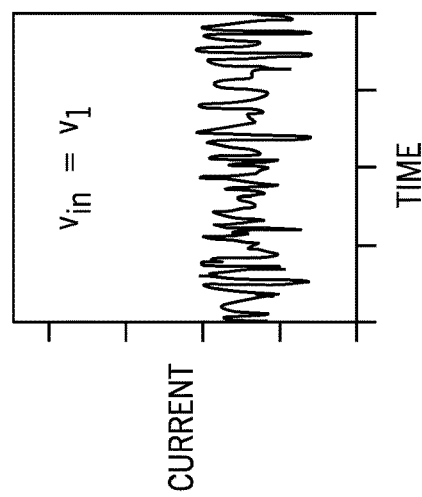

FIGS. 6A and 6B illustrate two different oscillations (current as a function of time) of the oscillating signal 106 (FIG. 1) produced by the nano-scale oscillator 102 according to some examples. FIG. 6A shows chaotic oscillation in response to a first value ($v_1$) of the input voltage $v_{in}$ (which causes chaotic behavior of the nano-scale oscillator 102), and FIG. 6B shows ordered oscillation in response to a second, different value ($v_2$) of the input voltage $v_{in}$ (which causes ordered behavior of the nano-scale oscillator 102).

Figure 7:
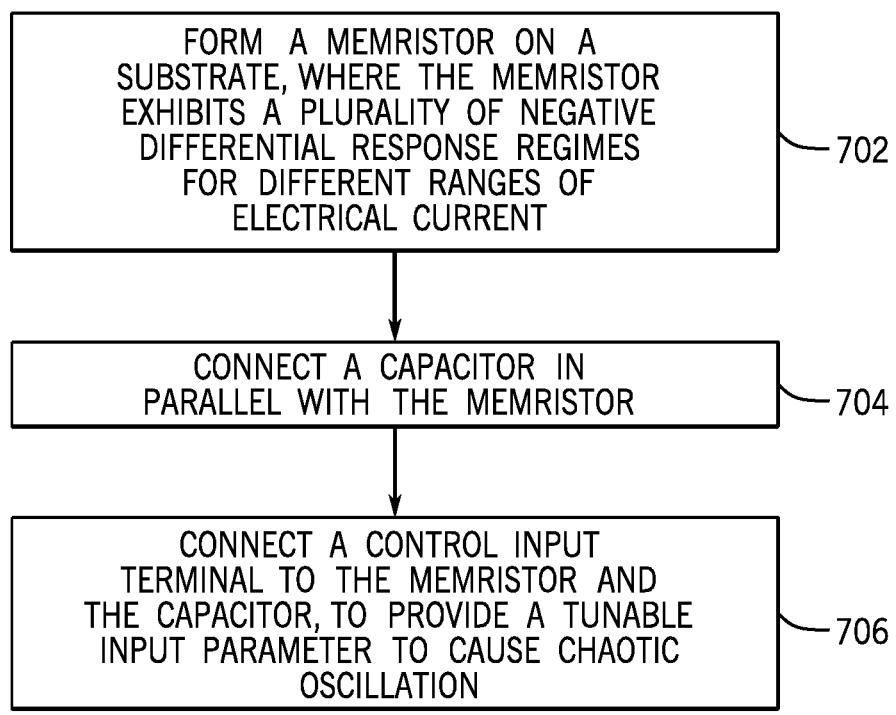
FIG. 7 is a flow diagram of a process of forming a device, according to some examples.

FIG. 7 is a flow diagram of a process of forming a device according to some examples. The process includes forming (at 702) a memristor on a substrate, wherein the memristor exhibits a plurality of negative differential response regimes for different ranges of electrical current. The process further includes connecting (at 704) a capacitor in parallel with the memristor, and connecting (at 706) a control input terminal (e.g. the terminal of the nano-scale oscillator 102 through which the control input 104 is provided) to the memristor and the capacitor, to provide a tunable input parameter to the memristor and the capacitor to cause chaotic oscillation. The control input terminal can be connected to the memristor and capacitor through a series resistor. In some examples, the parallel capacitor can be separate from the memristor. In other examples, the parallel capacitor may be a capacitance integrated into the memristor, where the integrated capacitance can be between the electrodes of the memristor.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A device comprising:
a nano-scale oscillator that exhibits chaotic oscillation responsive to a control input to the nano-scale oscillator, the control input including a tunable input parameter, wherein the tunable input parameter comprises a tunable input voltage, and wherein the nano-scale oscillator exhibits a plurality of negative differential response regimes within a same range of positive values of the tunable input voltage, a first negative differential response regime of the plurality of negative differential response regimes comprising a first range of currents, and a second negative differential response regime of the plurality of negative differential response regimes comprising a second range of currents different from the first range of currents, the second negative differential response regime comprising negative differential response portions that form a hysteresis loop.

2. The device of claim 1, wherein the nano-scale oscillator comprises a non-linear component that exhibits a non-linear response to an input parameter.

3. The device of claim 2, wherein the non-linear component exhibits a non-linear response to temperature.

4. The device of claim 3, wherein the plurality of negative differential response regimes are part of a negative differential response of the non-linear component, the negative differential response comprising one of a negative differential resistance, negative differential capacitance, and negative differential inductance.

5. The device of claim 2, wherein the non-linear component comprises a memristor.

6. The device of claim 2, wherein the non-linear component comprises electrodes and a layer between the electrodes, the layer comprising a first portion formed of a material comprising a metal nitride.

7. The device of claim 6, wherein the layer comprises a second portion formed of a material that provides a metal-insulator transition in response to the input voltage.

8. The device of claim 2, wherein the nano-scale oscillator further comprises a capacitor connected in parallel with the non-linear component, wherein the capacitor is separate from the non-linear component or is part of the non-linear component.

9. An oscillator comprising:
a non-linear component comprising electrical conductors and a nano-scale via interconnecting the electrical conductors; and
a capacitor connected in parallel with the non-linear component,
wherein the non-linear component and the capacitor are responsive to a tunable input voltage to produce an oscillating signal exhibiting chaotic behavior, the oscillating signal having irregular variations responsive to changes in the tunable input voltage, and wherein the oscillator exhibits a plurality of negative differential response regimes within a same range of positive values of the tunable input voltage, a first negative differential response regime of the plurality of negative differential response regimes comprising a first range of currents, and a second negative differential response regime of the plurality of negative differential response regimes comprising a second range of currents different from the first range of currents, the second negative differential response regime comprising negative differential response portions that form a hysteresis loop.

10. The oscillator of claim 9, wherein the nano-scale via includes a first layer formed of a material that provides a metal-insulator transition in response to the input voltage, and a second layer comprising a nitride.

11. A method of forming an electronic device, comprising:
forming a memristor on a substrate, wherein the memristor exhibits a plurality of negative differential response regimes for different ranges of electrical current corresponding to a same range of positive values of a tunable input voltage to the electronic device, and wherein a first negative differential response regime of the plurality of negative differential response regimes comprises a first range of electrical currents, and a second negative differential response regime of the plurality of negative differential response regimes comprises a second range of electrical currents different from the first range of electrical currents, the second negative differential response regime comprising negative differential response portions that form a hysteresis loop;
connecting a capacitor in parallel with the memristor; and
connecting a control input terminal to the memristor and the capacitor to provide the tunable input voltage to the memristor and the capacitor to cause chaotic oscillation that has irregular variations responsive to changes in input to the electronic device.

12. The method of claim 11, further comprising connecting the control input terminal to the memristor and the capacitor through a series resistor.

13. The device of claim 1, wherein the first range of currents of the first negative differential response regime is discrete from the second range of currents of the second negative differential response regime.

14. The device of claim 1, wherein for a given input voltage, the nano-scale oscillator has a plurality of equilibrium regions comprising an unstable equilibrium region between stable equilibrium regions.

15. The device of claim 6, wherein the metal nitride of the first portion is selected from among a titanium nitride and a hafnium nitride.

16. The device of claim 7, wherein the material of the second portion comprises a metal oxide.

17. The device of claim 7, wherein the material of the second portion comprises niobium oxide.

18. The oscillator of claim 10, wherein the nitride of the second layer comprises a metal nitride.

* * * * *